United States Patent
Lin et al.

(10) Patent No.: US 8,822,236 B2
(45) Date of Patent: Sep. 2, 2014

(54) HYDROGEN-BLOCKING FILM FOR FERROELECTRIC CAPACITORS

(71) Applicant: Texas Instruments Incorporated, Dallas, TX (US)

(72) Inventors: Bo-Yang Lin, Richardson, TX (US); Yen Lee, Plano, TX (US); Haowen Bu, Plano, TX (US); Mark Robert Visokay, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/949,581

(22) Filed: Jul. 24, 2013

(65) Prior Publication Data

US 2013/0309783 A1    Nov. 21, 2013

Related U.S. Application Data

(62) Division of application No. 13/432,736, filed on Mar. 28, 2012.

(60) Provisional application No. 61/530,281, filed on Sep. 1, 2011.

(51) Int. Cl.
*H01L 21/00* (2006.01)
*H01L 49/02* (2006.01)
*H01L 27/115* (2006.01)
*H01L 21/02* (2006.01)

(52) U.S. Cl.
CPC .......... *H01L 21/02225* (2013.01); *H01L 28/55* (2013.01); *H01L 27/11507* (2013.01); *H01L 28/57* (2013.01)
USPC .............................................. 438/3; 257/295

(58) Field of Classification Search
CPC ................... H01L 21/02225; H01L 27/11507; H01L 28/55; H01L 28/57
USPC .............................................. 438/3; 257/295
See application file for complete search history.

(56) References Cited

U.S. PATENT DOCUMENTS

| | | |
|---|---|---|
| 6,656,748 B2 | 12/2003 | Hall et al. |
| 6,924,241 B2 | 8/2005 | Lee |
| 6,953,609 B2 | 10/2005 | Carollo |

(Continued)

OTHER PUBLICATIONS

"Plasmalab Data: NH3 free PECVD of Si3N4" (Oxford Instruments plc, Oct. 2003), available at www.oxfordplasma.de/process/sin_nfre.htm.

Yota et al., "Comparison Between HDP CVD and PECVD Silicon Nitride for Advanced Interconnect Applications," Proceedings of the IEEE 2000 International Interconnect Technology Conference (IEEE, 2000), pp. 76-78.

(Continued)

*Primary Examiner* — Daniel Whalen
(74) *Attorney, Agent, or Firm* — Rose Alyssa Keagy; Frederick J. Telecky, Jr.

(57) ABSTRACT

An ammonia-free method of depositing silicon nitride by way of plasma-enhanced chemical vapor deposition (PECVD). Source gases of silane ($SiH_4$) and nitrogen ($N_2$) are provided to a parallel-plate plasma reactor, in which energy is capacitively coupled to the plasma, and in which the wafer being processed has been placed at a support electrode. Low-frequency RF energy (e.g., 360 kHz) is applied to the support electrode; high-frequency RF energy (e.g., 13.56 MHz) is optionally provided to the parallel electrode. Process temperature is above 350° C., at a pressure of about 2.5 torr. Any hydrogen present in the resulting silicon nitride film is bound by N—H bonds rather than Si—H bonds, and is thus more strongly bound to the film. The silicon nitride can serve as passivation for ferroelectric material that may degrade electrically if contaminated by hydrogen.

9 Claims, 7 Drawing Sheets

(56) References Cited

U.S. PATENT DOCUMENTS 6,982,448 B2   1/2006   Udayakumar et al.
7,019,352 B2   3/2006   Udayakumar et al.
7,183,602 B2   2/2007   Udayakumar et al.

OTHER PUBLICATIONS

Yota et al., "A comparative study on inductively-coupled plasma high-density plasma, plasma-enhanced, and low pressure chemical vapor deposition silicon nitride films", J. Vac. Sci. Technol. A, vol. 18 (American Vacuum Society, 2000), pp. 372-376.

HYDROGEN-BLOCKING FILM FOR FERROELECTRIC CAPACITORS

CROSS-REFERENCE TO RELATED APPLICATIONS

This application is a divisional of U.S. patent application Ser. No. 13/432,736 filed Mar. 28, 2012, which claims priority under 35 U.S.C. §119(e), of Provisional Application No. 61/530,281, filed Sep. 1, 2011, the contents of both are incorporated herein by this reference.

STATEMENT REGARDING FEDERALLY SPONSORED RESEARCH OR DEVELOPMENT

Not applicable.

BACKGROUND OF THE INVENTION

This invention is in the field of integrated circuit manufacture. Embodiments of this invention are more specifically directed to the formation of a silicon nitride film formed over a ferroelectric capacitor structure in an integrated circuit.

Conventional metal-oxide-semiconductor (MOS) and complementary MOS (CMOS) logic and memory devices are prevalent in modern electronic devices and systems, as they provide an excellent combination of fast switching times and low power dissipation, along with their high density and suitability for large-scale integration. As is fundamental in the art, however, those devices are essentially volatile, in that logic and memory circuits constructed according to these technologies do not retain their data states upon removal of bias power. Especially in mobile and miniature systems, the ability to store memory and logic states in a non-volatile fashion is very desirable. As a result, various technologies for constructing non-volatile devices have been developed in recent years.

A recently developed technology for realizing non-volatile solid-state memory devices involves the construction of capacitors in which the dielectric material is a polarizable ferroelectric material, such as lead zirconate titanate (PZT) or strontium-bismuth-tantalate (SBT), rather than silicon dioxide or silicon nitride as typically used in non-ferroelectric capacitors. Hysteresis in the charge-vs.-voltage (Q-V) characteristic, based on the polarization state of the ferroelectric material, enables the non-volatile storage of binary states in those capacitors. In contrast, conventional MOS capacitors lose their stored charge on power-down of the device. It has been observed that ferroelectric capacitors can be constructed by processes that are largely compatible with modern CMOS integrated circuits, for example placing capacitors above the transistor level, between overlying levels of metal conductors.

FIG. 1 illustrates an example of a Q-V characteristic of a conventional ferroelectric capacitor. As shown, the charge (Q) stored across the conductive plates depends on the voltage applied to the plates (V), and also on the recent history of that voltage. If the voltage V applied across the capacitor plates exceeds a "coercive" voltage $+V_\alpha$, the capacitor polarizes into the "+1" state. According to this characteristic, once polarized to the "+1" state, so long as voltage V remains above coercive voltage $-V_\beta$, the capacitor exhibits a stored charge of $+Q_1$. Conversely, if the voltage V applied across the capacitor plates is more negative than coercive voltage $-V_\beta$, the capacitor is polarized into the "-1" state, and will exhibit a stored charge of $-Q_2$ for applied voltage V below $+V_\alpha$.

An important characteristic of ferroelectric capacitors, for purposes of non-volatile storage in integrated circuits, is the difference in capacitance exhibited by a ferroelectric capacitor between its polarized states. As fundamental in the art, the capacitance of an element refers to the ratio of stored charge to applied voltage. In the context of a ferroelectric capacitor, the change in polarization state that occurs upon application of a polarizing voltage is reflected in charge storage. For example, referring to FIG. 1, the polarization of a ferroelectric capacitor from its "-1" state to its "+1" state is reflected in a relatively high capacitance C(-1), by way of which polarization charge involved in the change of polarization state is retained within the capacitor as the voltage exceeds its coercive voltage $V_\alpha$; on the other hand, a capacitor already in its "+1" state exhibits little capacitance C(+1) due to polarization, since its ferroelectric domains are already aligned prior to the application of the voltage. In each case, the ferroelectric capacitor also has a linear capacitance, by virtue of its construction as parallel plates separated by a dielectric film (i.e., the ferroelectric material). As will be evident from the following description, a stored logic state is read by interrogating the capacitance of ferroelectric capacitors to discern its polarized state.

Ferroelectric technology is now utilized in non-volatile solid-state read/write random access memory (RAM) devices. These memory devices, commonly referred to as "ferroelectric RAM", or "FeRAM", or "FRAM" devices, are now commonplace in many electronic systems, particularly portable electronic devices and systems. FeRAMs are especially attractive in implantable medical devices, such as pacemakers and defibrillators. Various memory cell architectures including ferroelectric capacitors are known in the art, including the well-known 2T2C (two transistor, two capacitor) cells. Another type of FeRAM cell is based on the well-known "6T" CMOS static RAM cell, which operates as an SRAM cell during normal operation, but in which ferroelectric capacitors coupled to each storage node can be programmed with the stored data state to preserve memory contents in non-volatile fashion. Ferroelectric capacitors are also implemented in some integrated circuits as programmable analog capacitors.

It has been observed that the properties of conventional ferroelectric capacitors are quite sensitive to the presence of hydrogen. More specifically, the infiltration of hydrogen into the ferroelectric film is believed to cause degradation in the hysteresis characteristic of the ferroelectric capacitor, primarily by inhibiting its programmability into two separate states. FIGS. 2a and 2b illustrate a theory of the mechanism for this degradation as caused by hydrogen in the ferroelectric film.

FIG. 2a illustrates the crystalline structure of PZT ferroelectric material by way of a unit cell having lead atoms 2 at its vertices, and oxygen atoms 4 at the center of each face. Zirconium titanate molecule 5 resides at one of two possible positions in the interior of this unit cell, at each of which it can bond to oxygen atoms 4. Position 6 is empty in the illustration of FIG. 2a, and is the other position in the crystal structure at which oxygen bonds are available to zirconium titanate molecule 5. An electric field applied in parallel with the axis of the two interior positions of the unit cell can move zirconium titanate molecule 5 from one position to the other; it is this change in position of zirconium titanate molecule 5 that causes the hysteresis behavior in the C-V plot, as shown in FIG. 1.

FIG. 2b illustrates this same crystalline structure of PZT ferroelectric material, but in which the crystal has been contaminated by hydrogen atom 6H. As shown in FIG. 2b, hydrogen atom 6H occupies bonds to oxygen atoms 4 at one of the two interior positions of the crystal unit cell. With those available bonds now occupied, zirconium titanate molecule 5 cannot readily change its position within the PZT crystal in response to an applied electric field. The hysteresis characteristic of the ferroelectric capacitor will thus collapse to the extent that cells of the crystal structure of the ferroelectric material are hydrogen-contaminated in the manner shown in FIG. 2b.

Conventional process flows for manufacturing ferroelectric capacitors have addressed the issue of hydrogen contamination of the ferroelectric material by depositing passivation films over the ferroelectric capacitor structure. FIG. 3 is a cross-sectional view of a ferroelectric capacitor structure within an integrated circuit, constructed according to an example of such a conventional fabrication method. In the structure of FIG. 3, an n-channel MOS transistor is realized at the surface of p-type substrate 10 (or well), at an active region disposed between isolation dielectric structures 15 (formed by shallow trench isolation in this example). N+ source/drain regions 14 are formed into substrate 10 on opposing sides of polysilicon gate element 16 in a self-aligned manner. Gate element 16 is separated from the surface of the active region by gate dielectric 17, thus forming the MOS transistor. Sidewall spacers 19 are provided on the sides of gate element 16 as useful in forming source/drain region extensions, as known in the art. A ferroelectric capacitor is formed by a ferroelectric stack including conductive plates 20a, 20b (formed of an elemental metal, or a conductive metal compound such as a nitride or silicide, or a stack of two or more of these layers) between which ferroelectric material 22 is disposed. In this example, ferroelectric material 22 consists of PZT. Typically, as known in the ferroelectric integrated circuit art, this ferroelectric stack is formed by the sequential deposition of the conductive and ferroelectric materials, etched to the desired dimensions by a single stack etch. Bottom conductive plate 20a is connected to the source/drain region 14 by conductive plug 18 formed into a contact opening etched through dielectric film 13.

To inhibit hydrogen contamination of ferroelectric material 22, multiple passivation films are formed over the ferroelectric stack as shown in FIG. 3. In this conventional example, aluminum oxide layer 24 is first formed over the ferroelectric stack by conventional chemical vapor deposition or atomic layer deposition, for example to a thickness of about 25 nm. This aluminum oxide layer 24 is quite conformal to the non-planar structure of the ferroelectric stack, serves as a hydrogen barrier, and also as a chemical barrier between ferroelectric material 22 and the other passivation films.

Silicon nitride layer 25 is then formed over aluminum oxide layer 24 in this conventional arrangement, for example to a thickness of about 50 nm, by high-density plasma (HDP) chemical vapor deposition (CVD). As known in the art, HDP CVD is a specific type of plasma-enhanced chemical vapor deposition (PECVD) in which an inductively-coupled plasma (ICP) creates a high-density plasma in the processing reactor, in contrast to parallel-plate plasma reactors in which energy is capacitively coupled to the plasma. Yota et al., "A comparative study on inductively-coupled plasma high-density plasma, plasma-enhanced, and low pressure chemical vapor deposition silicon nitride films" *J. Vac. Sci. Technol. A*, 18(2) (American Vacuum Society, March/April 2000), pp. 372-76, describes a process for depositing CVD silicon nitride by way of HDP techniques, in which the gas species provided to the HDP reactor are $SiH_4$ and $N_2$, with argon as a dilution gas. In contrast, the conventional PECVD silicon nitride film described in this article uses gas species of $SiH_4$ and $NH_3$, with $N_2$ as the dilution gas, all of which are injected into a parallel plate plasma reactor. The Yota et al. article further describes that the HDP silicon nitride film contains less hydrogen than does the conventional PECVD film. In addition, the hydrogen contained in the HDP nitride film is present in the form of N—H bonds, rather than as Si—H; the Yota et al. article asserts that the hydrogen from Si—H bonds is more easily broken than that from N—H bonds.

As shown in FIG. 3, another silicon nitride film 26 overlies HDP nitride film 25. This top silicon nitride film is commonly in the form of "UV nitride", which refers to a silicon nitride film that is transmissive to ultraviolet light. UV nitride is typically deposited by way of conventional PECVD in a parallel-plate reactor, with $SiH_4$ and $NH_3$ as the source gases and $N_2$ as a dilution gas. U.S. Pat. No. 6,924,241 describes a process in which a low concentration of $NH_3$ source gas is used in the PECVD of UV transmissive nitride, to improve the UV transmittance of the film. In the conventional example of FIG. 3, UV nitride 26 is deposited to a thickness (e.g., about 50 nm) sufficient to fill any gaps or thin spots (i.e., voids) in HDP nitride 25, and to increase the thickness of the overall passivation layer, considering that the step coverage of HDP nitride film 25 is typically quite poor.

However, the use of HDP CVD to form the first nitride layer (nitride film 25 in FIG. 3) is a costly and complicating process step in the overall manufacturing flow of the integrated circuit including the ferroelectric capacitor. As known by those in the industry, HDP (i.e., inductively-coupled plasma) reactors are relatively expensive. Manufacturing process flows thus avoid HDP CVD to the extent possible. If HDP CVD is required for a specific purpose, use of the HDP reactor is generally limited to those specific processes, to minimize the cost of adding additional HDP capacity. Even so, the insertion of an HDP CVD process into the manufacturing flow can result in bottlenecks, and limits the extent to which multiple processes are performed in situ in a single reactor.

BRIEF SUMMARY OF THE INVENTION

Embodiments of this invention provide a method of forming a silicon nitride film in an integrated circuit structure, and the integrated circuit structure so formed, by way of capacitively-coupled plasma PECVD process, where the film includes little or no mobile hydrogen.

Embodiments of this invention provide such a method and structure that is well-suited for use as a passivation layer over ferroelectric material.

Embodiments of this invention provide such a method and structure that is compatible with extremely small feature sizes as now prevalent in modern integrated circuits.

Embodiments of this invention provide such a method and structure that can be incorporated into a single-step, in situ, process for forming a stack of passivation layers to overlie ferroelectric material.

Other objects and advantages of embodiments of this invention will be apparent to those of ordinary skill in the art having reference to the following specification together with its drawings.

An embodiment of this invention may be implemented into a process of forming a silicon nitride film by way of plasma enhanced chemical vapor deposition (PECVD) in which an ammonia-free chemistry is excited in a capacitively-coupled plasma created by dual-frequency RF power. The chemistry includes silane ($SiH_4$) and nitrogen ($N_2$) gases. Energy applied to the parallel plates generating the plasma is at relatively low ratio of high frequency to low frequency applied power (e.g., from zero to about 2.0), at a temperature greater than about 350°. The resulting silicon nitride film has a relatively low ratio of H—Si bonds to H—N bonds, indicating that such hydrogen as present in the film is tightly bound and less likely to contaminate nearby ferroelectric material.

DETAILED DESCRIPTION OF THE INVENTION

The present invention will be described in connection with its preferred embodiment, namely as implemented into a process of manufacturing an integrated circuit including ferroelectric capacitors over which passivation films are formed, as it is contemplated that this invention will be especially beneficial in such an application. However, it is contemplated that this invention will be beneficial when applied to other uses and applications. Accordingly, it is to be understood that the following description is provided by way of example only, and is not intended to limit the true scope of this invention as claimed.

Figure 1:
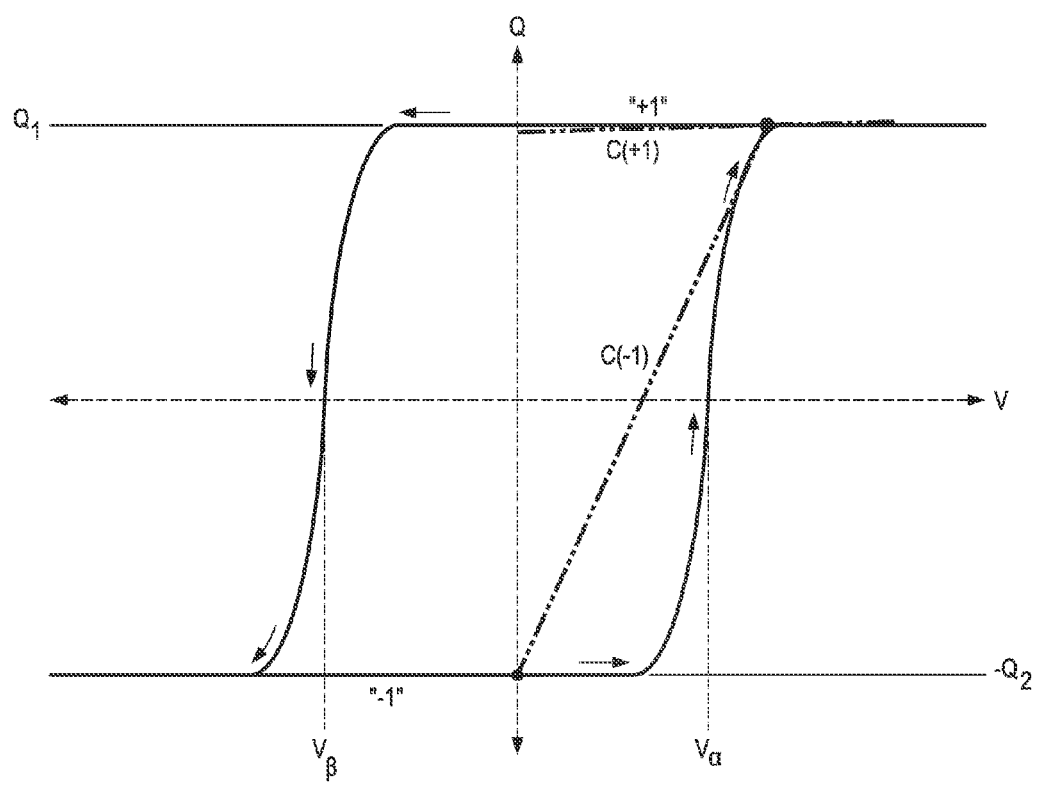
FIG. 1 is a plot of a charge-vs.-voltage characteristic of a conventional ferroelectric capacitor.
Figure 2A:
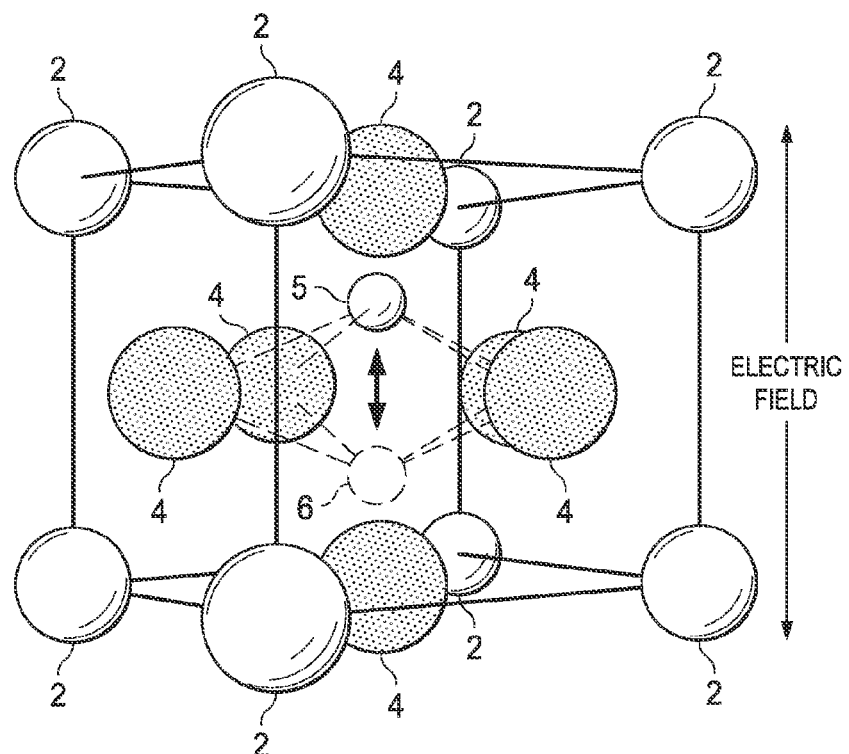
FIGS. 2a and 2b are schematic diagrams illustrating the crystalline structure of a conventional ferroelectric material, and the degradation mechanism resulting from hydrogen contamination.
Figure 2B:
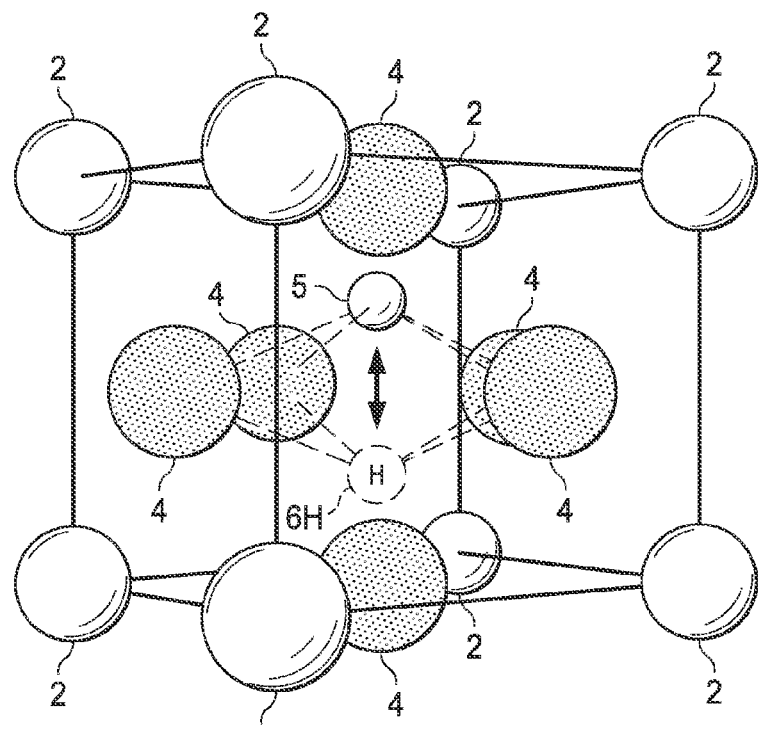
Figure 3:
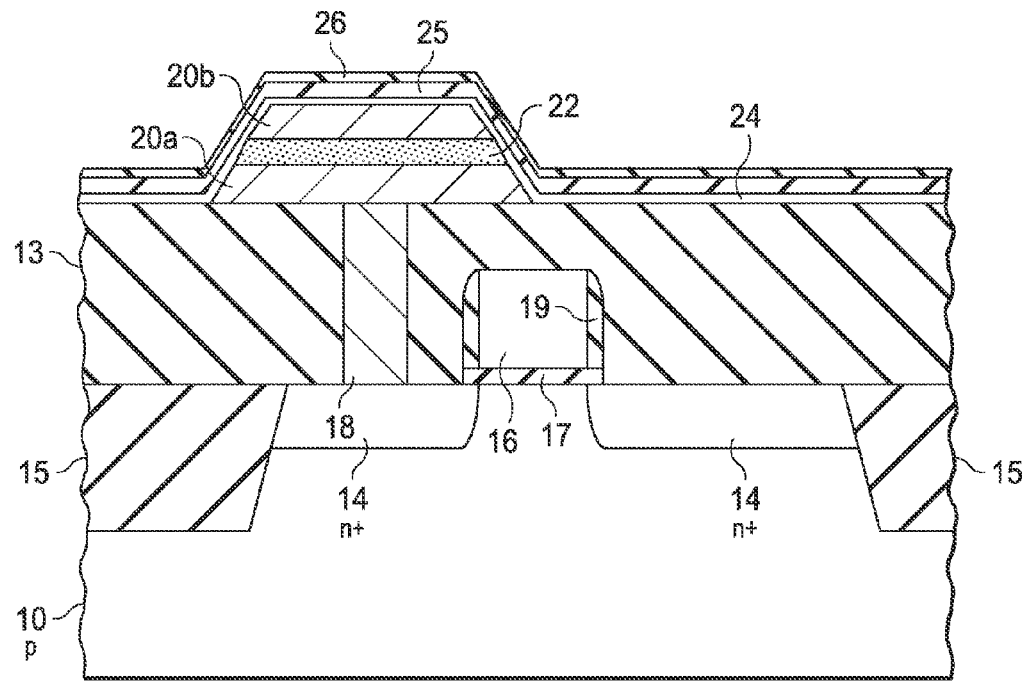
FIG. 3 is a cross-sectional view illustrating a portion of an integrated circuit including a ferroelectric capacitor underlying passivation films constructed according to conventional methods.
Figure 5A:
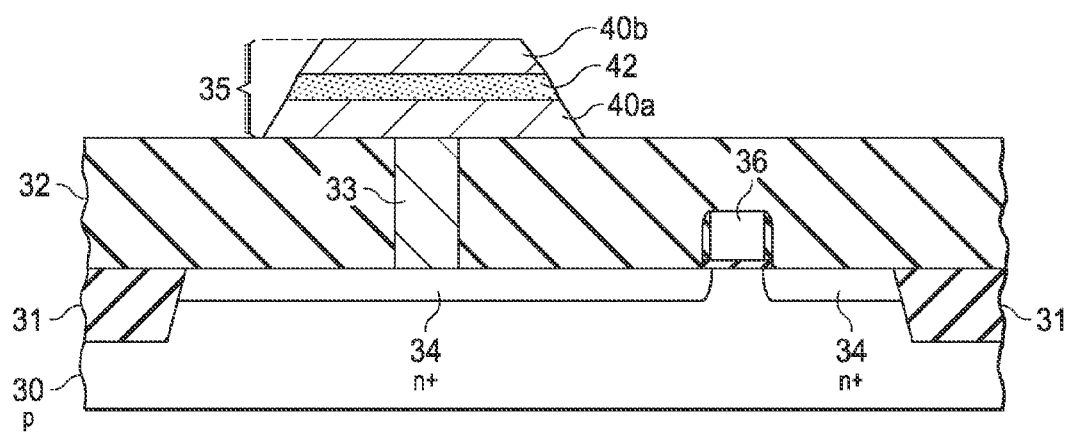
FIGS. 5a through 5d are cross-sectional views of a portion of an integrated circuit including a ferroelectric capacitor, at various stages of manufacture according to embodiments of this invention.

Referring to FIGS. 4 and 5a through 5d, a process of manufacturing particular structures within an integrated circuit according to embodiments of this invention will now be described in detail. According to an embodiment of this invention, passivation films are formed overlying ferroelectric capacitors that are disposed overlying transistors and other semiconductor structures. As such, the manufacturing flow of FIG. 4 begins with process 50, in which transistors are formed at or near the semiconducting surface of a substrate or other support body. FIG. 5a shows, in cross-section, an example of such a transistor, formed at the surface of p-type bulk substrate 30. Alternatively, transistors and other semiconductor structures are formed at or near the surface of a semiconductor layer that itself overlies an insulator layer, such as according to a silicon-on-insulator (SOI) technology as known in the art. In process 50, isolation dielectric structures 31, the appropriate doped wells (not shown), gate electrodes 36, and source/drain regions 34, among other structures, are formed at or near the surface of substrate 30 according to conventional MOS processes, as is well-known in the art. In this example, isolation dielectric structures 31 are formed by way of shallow trench isolation techniques to define active regions of the surface at which transistors are formed. An n-channel MOS transistor is illustrated in the example of FIG. 5a, formed in the conventional manner by deposition and photolithographic patterning and etch of polysilicon material to define gate electrode 36 overlying a gate dielectric; n-type source/drain regions 34 are formed on either side of gate electrode 36 in this example by ion implantation and subsequent activation anneal, in the well-known self-aligned manner.

In process 52, first interlevel dielectric 32 is then deposited over the transistors formed in process 50, for example by way of chemical vapor deposition. First dielectric material 32 may be formed of CVD silicon dioxide or another suitable material, and may be planarized after its deposition, for example by way of chemical mechanical polishing or another etchback technique. In process 54, contact openings (i.e., vias) are etched through this first interlevel dielectric at selected locations, and conductive plugs 33 are formed into those vias in the conventional manner. In the example of FIG. 5a and as will be described in further detail below, conductive plug 33 provides an electrical contact between source/drain region 34 of an underlying MOS transistor and an overlying ferroelectric capacitor. Conductive plug 33, may be formed of a metal such as tungsten, titanium, and the like, or an alloy thereof, Following the formation of the first interlevel dielectric layer in process 52, and the via etch and conductor formation in process 54, ferroelectric capacitors are formed in the integrated circuit in process 56 according to this embodiment of the invention. In the example shown in FIG. 5a, ferroelectric capacitor 35 is a ferroelectric "sandwich" stack of conductive plates 40a, 40b (each formed of elemental metal, or a conductive metal compound such as a nitride or silicide) between which ferroelectric material 42 such as PZT is disposed. In this example, process 56 includes the sequential deposition of the conductive and ferroelectric materials overall, according to conventional processes, followed by photolithographic patterning to define the location of ferroelectric capacitor 35, and a single stack etch of conductive plates 40a, 40b, and ferroelectric material 42. Commonly assigned U.S. Pat. No. 6,656,748, incorporated herein by reference, describes an example of ferroelectric stack formation and etch process 56, suitable for use in connection with embodiments of this invention.

Figure 4:
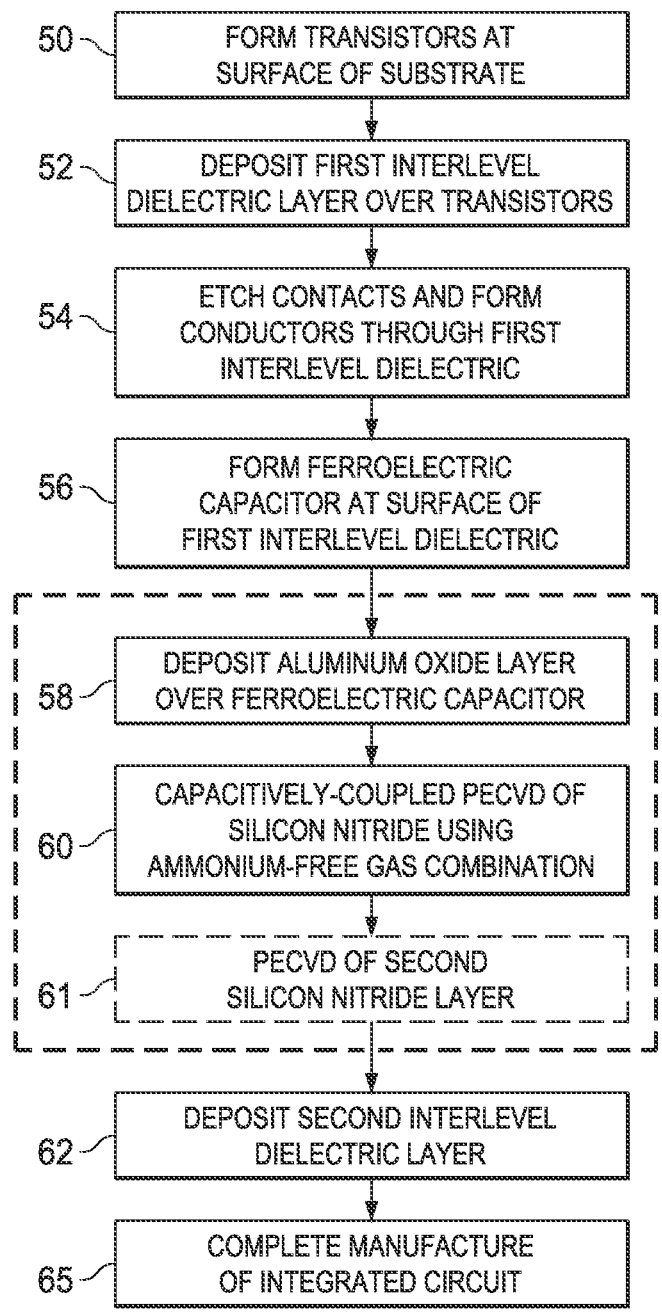
FIG. 4 is a flow diagram illustrating a process of forming a ferroelectric capacitor with passivation films according to embodiments of this invention.
Figure 5B:
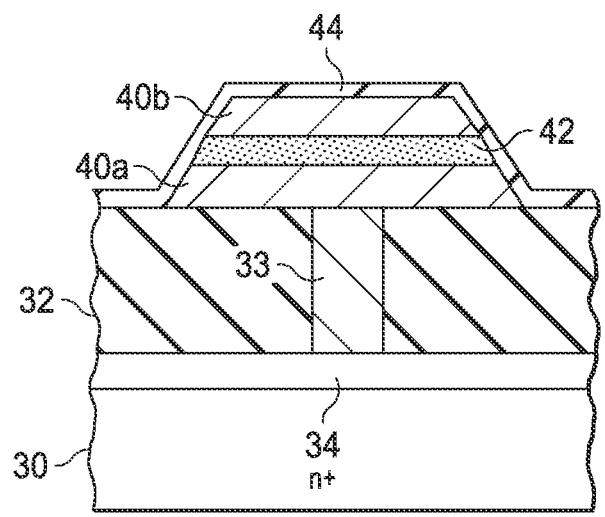

Referring to FIG. 4 in combination with FIG. 5b, process 58 is next performed to deposit aluminum oxide layer 44 overall, including over the top surfaces of conductive plates 40a, 40b and ferroelectric material 42. Aluminum oxide layer 44 serves as an insulating sidewall diffusion barrier, inhibiting hydrogen contamination of ferroelectric material 42. In addition, aluminum oxide layer 44 inhibits diffusion of lead from PZT ferroelectric material 42, which could contaminate structures outside of ferroelectric capacitor 35. It is contemplated that aluminum oxide layer 44 will typically be formed by chemical vapor deposition or by atomic layer deposition. Aluminum oxide layer 44 as deposited is relatively thin, for example on the order of 25 nm in thickness. This aluminum oxide layer 44 may be patterned and etched at this point in the process, if desired, etched later (e.g., as a stack with other passivation layers yet to be deposited), or may remain overall as part of a next interlevel dielectric layer.

Figure 5C:
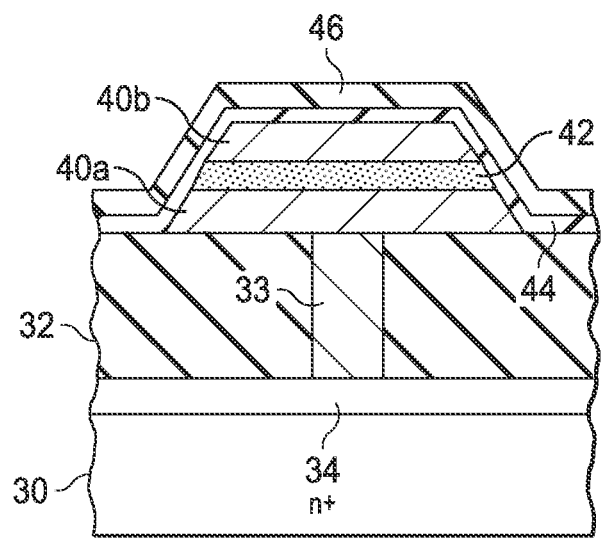
Figure 5D:
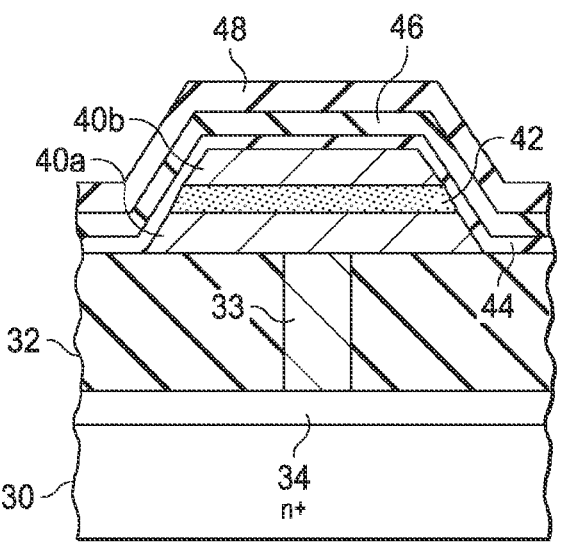

According to embodiments of this invention, referring to FIGS. 4 and 5c, low-hydrogen silicon nitride layer 46 is next formed overall, by way of plasma-enhanced chemical vapor deposition (PECVD) process 60. PECVD nitride deposition process 60 differs dramatically from conventional PECVD nitride deposition by way of its gas chemistry and its power conditions, among other aspects.

More specifically, it has been discovered that the use of ammonia ($NH_3$) as a reagent gas in the PECVD of silicon nitride, even at low concentrations, results in hydrogen within the resulting silicon nitride film that can readily migrate into the underlying PZT ferroelectric material, and degrade its ferroelectric characteristics. Accordingly, embodiments of this invention carry out PECVD nitride deposition process 60 without the use of ammonia ($NH_3$) source gas, but instead use molecular nitrogen ($N_2$) gas as the source gas for deposition of low-hydrogen silicon nitride layer 46. The source gas for silicon in process 60 according to this embodiment of the invention is silane ($SiH_4$), as is conventional in the art. Argon (Ar) may optionally be sourced into the chamber to sustain the plasma, as known in the art, but is not essential to process 60 according to embodiments of this invention. Reduction in the hydrogen content in the resulting silicon nitride film due to the introduction of argon in deposition process 60 has also been observed in connection with this invention.

According to embodiments of this invention, PECVD nitride deposition process 60 is performed in a parallel-plate plasma reactor, in which energy is capacitively coupled to the plasma. However, it is known in the art and has been observed, in connection with this invention, that dissociation of nitrogen gas is difficult in a parallel-plate PECVD reactor operated under conventional process conditions, significantly more so than in an HDP plasma reactor, for example. According to embodiments of this invention, that difficulty is overcome by the manner in which the parallel-plate PECVD reactor is operated in process 60, as will now be described.

Figure 6:
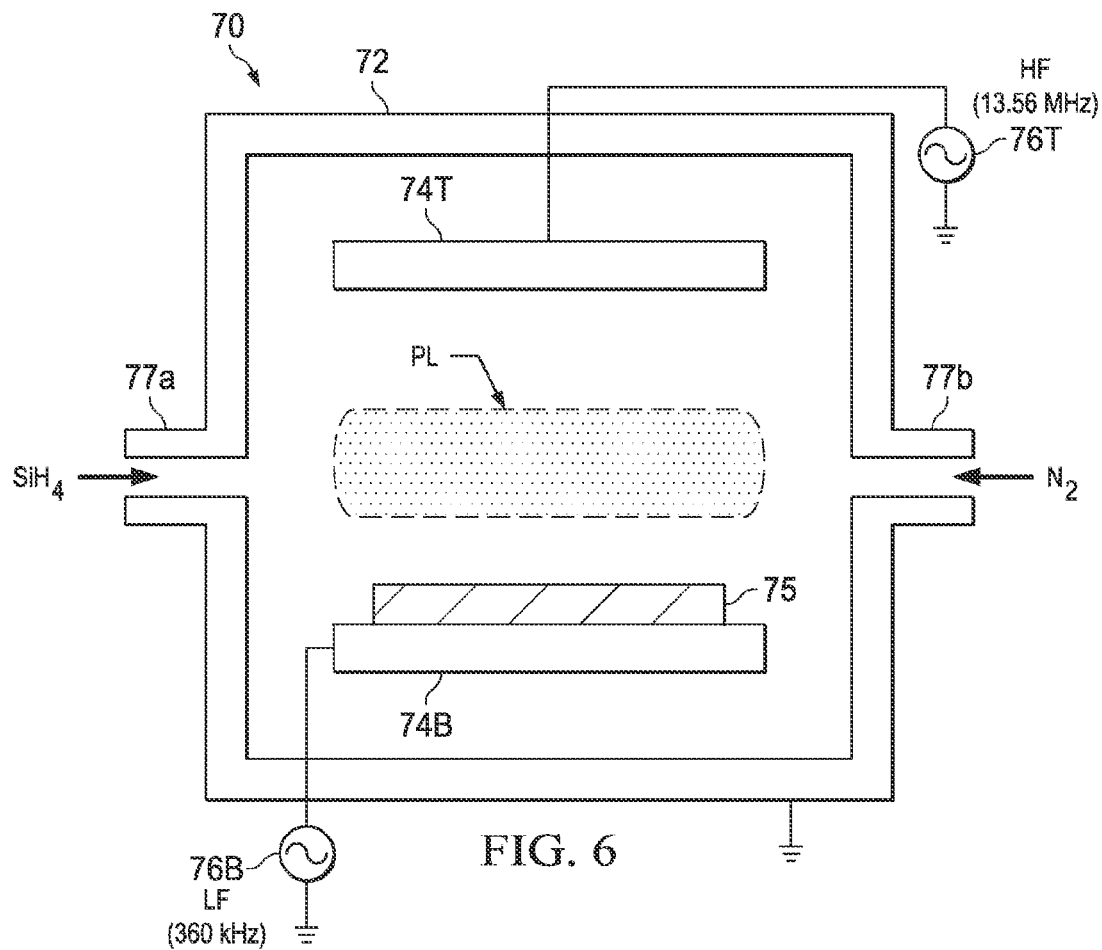
FIG. 6 is a schematic diagram illustrating, in cross-section, a parallel plate plasma reactor useful in connection with embodiments of this invention.

FIG. 6 schematically illustrates parallel-plate PECVD reactor 70 as used in PECVD nitride deposition process 60 according to embodiments of this invention. As shown in FIG. 6, reactor 70 includes chamber 72, within which a low pressure environment can be maintained by operation of a conventional vacuum system (not shown). Temperature control system (not shown) is also provided with reactor 70, for maintaining wafer 75 at the desired process temperature. Reactor 70 includes the parallel plate arrangement of top plate 74T and bottom plate 74B, between which plasma PL will be generated. Bottom plate 74B serves as the support for wafer 75, at the surface of which ferroelectric capacitor 35 has been formed and awaits silicon nitride layer 46 to be deposited in process 60 according to embodiments of this invention. Top plate 74T is powered by high frequency power source 76T, which in this embodiment operates at a frequency of on the order of ten MHz, for example 13.56 MHz. Bottom plate 74B is powered by low frequency power source 76B, which operates at a frequency of on the order of hundreds of kHz, for example 360 kHz. In this embodiment of the invention, the walls of chamber 72 are maintained at ground potential. Gas ports 77a and 77b admit the reagent gases, which in this embodiment of the invention are $SiH_4$ and $N_2$, respectively. According to embodiments of this invention, ammonia ($NH_3$) gas is not supplied to reactor 70; argon (Ar) gas may be supplied by way of another gas port (not shown) or as mixed with one of the reagent gases, for sustaining the plasma. In operation, the interior of chamber 74 is placed in a low-pressure, high temperature state, with the desired flows of reagent gases established through gas ports 77a, 77b. Bottom plate 74B is powered with the low frequency RF energy, and optionally the power of top plate 74T is powered with high frequency RF energy, so as to generate glow discharge plasma PL in the space between plates 74T, 74B. The RF energy capacitively couples to plasma PL in this parallel-pate arrangement of reactor 70. Free electrons within plasma PL have sufficient energy to collide with, and thus dissociate and ionize molecules of the $SiH_4$ and $N_2$ reagent gases. In this example, Si+ and N− ions are generated by plasma PL and react with one another to form silicon nitride, which deposits at the surface of wafer 75 to form silicon nitride layer 46.

Embodiments of this invention overcome the difficulty of dissociating nitrogen ($N_2$) gas in the deposition of silicon nitride layer 46 using parallel-plate PECVD reactor 70, in process 60, by way of certain process conditions, as will now be described. An example of the process conditions for the ammonia-free deposition of silicon nitride layer 46 in process 60, for the case of 300 mm diameter wafer 75, is summarized as:

Temperature: above 350° C., up to about 500° C., for example 400° C.
Pressure: low pressure (0.1 to 10 torr), for example 2.5 torr
Gas flows:
  Silane ($SiH_4$): from about 10 to 1000 sccm, for example 45 sccm
  Nitrogen ($N_2$): from about 3000 to about 9000 sccm, for example, 4500 sccm;
  Argon (Ar): typically zero, but may range up to 9000 sccm
  Ammonia ($NH_3$): zero
RF power:
  Low frequency (e.g., 360 kHz): from about 100 W to about 1000 W, for example, 400 to 600 W
  High Frequency (e.g., 13.56 MHz): from zero to about 800 W Under these conditions, reactor 708 generates plasma PL at a plasma density of from about $10^8$ to about $10^{10}$ $cm^{-3}$, which is in stark contrast to the plasma density in a typical HDP reactor of about $10^{11}$ to about $10^{12}$ $cm^{-3}$. Wafer 75 remains in reactor 70 under these conditions to deposit the desired thickness of silicon nitride layer 46, for example on the order of 50 nm. A post-deposition anneal may then be performed at a temperature of about 400° C. if desired, for up to 30 minutes (e.g., 20 minutes).

As evident from the above process conditions, much if not all of the RF power applied to plasma PL is low frequency (e.g., 360 kHz) power, rather than high frequency (e.g., 13.56 MHz) power. According to embodiments of this invention, the ratio of high frequency power to low frequency power applied in process 60 ranges from zero to not more than about 2.0. Under these power conditions, the dissociation and ionization of nitrogen from the $N_2$ source gas, and the resulting deposition, is largely dominated by a physical (e.g., sputtering) mechanism rather than a purely CVD mechanism, according to embodiments of this invention. It is believed that this low frequency RF power dominance is beneficial in dissociating nitrogen gas to a sufficient extent that reasonable deposition rates are attained.

The silicon nitride layer 46 resulting from process 60 according to embodiments of this invention has important and beneficial properties, particularly as compared with silicon nitride films deposited from conventional PECVD nitride deposition processes in which ammonia gas serves as the nitrogen source, including those using relatively low $NH_3$ flow rates. Of particular importance is the nature of the bonds for such hydrogen that resides in the nitride film. As mentioned above, it is known in the art that hydrogen more easily breaks away from Si—H bonds than from N—H bonds. It has been observed that silicon nitride films deposited by PECVD using $NH_3$ as a source gas produces silicon nitride in which hydrogen is present in the film both as Si—H bonds and as N—H bonds. Degradation of underlying ferroelectric material can then result.

Figure 7A:
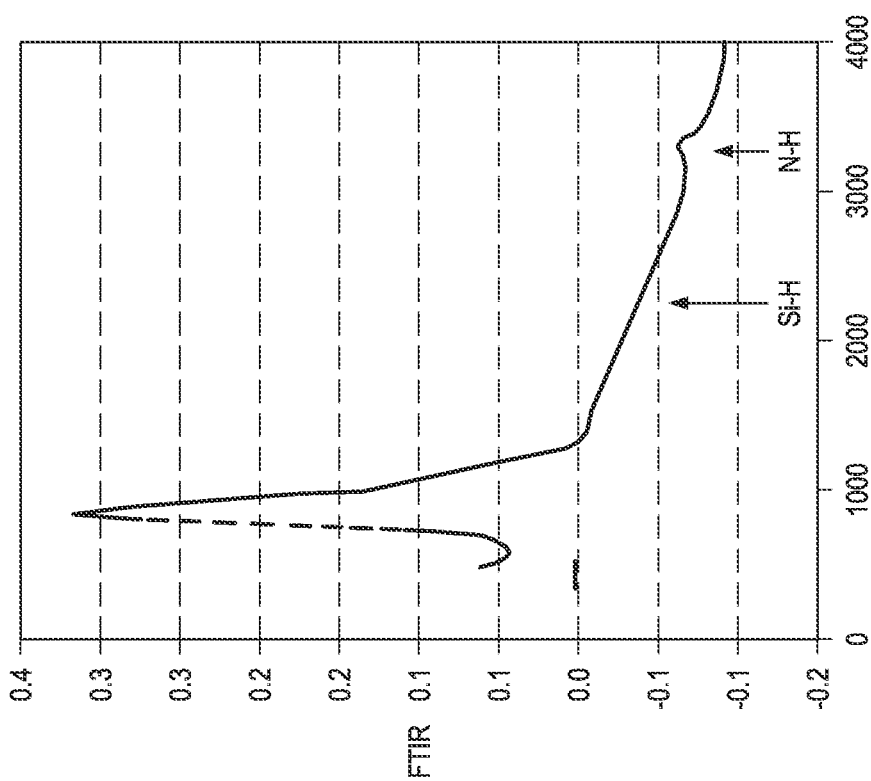
FIGS. 7a and 7b are plots of Fourier transform infrared spectroscopy spectra of samples of silicon nitride films constructed according to embodiments of this invention.
Figure 7B:
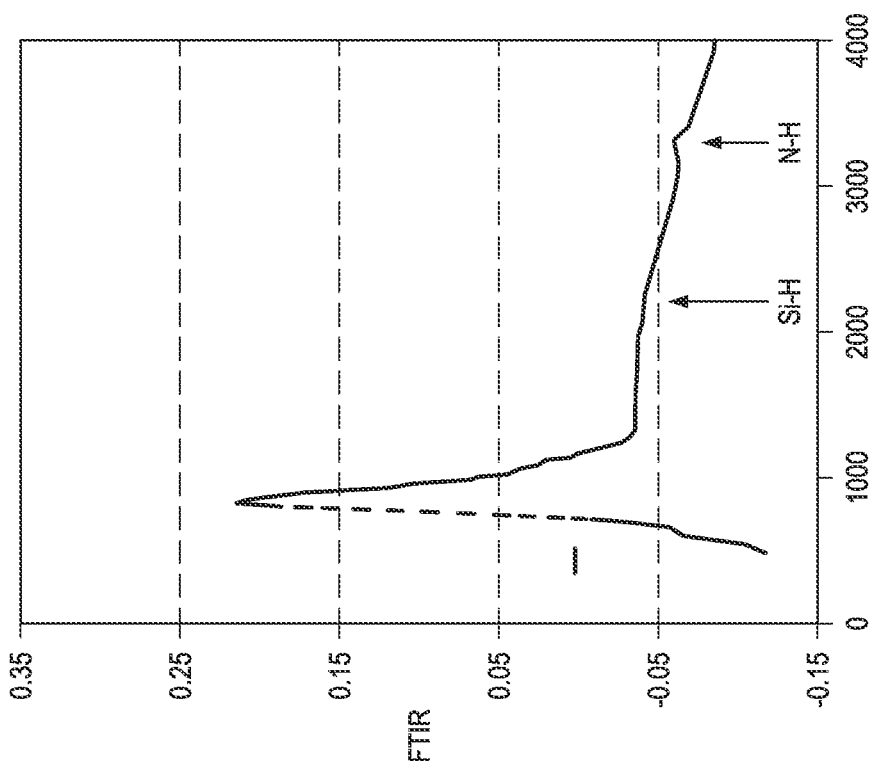

FIGS. 7a and 7b illustrate FTIR (Fourier transform infrared spectroscopy) scans of two samples of silicon nitride film deposited according to embodiments of the invention. Each of these samples were prepared in a parallel-plate PECVD reactor such as that described above in connection with FIG. 6, at a wafer temperature of 400° C. and a pressure of 2.5 torr, with the source gas of $N_2$ at 4500 sccm. No ammonia ($NH_3$) gas was introduced in the deposition of either sample. RF power of 600 W at 360 kHz was applied to bottom plate 74B, and top plate 74T was at ground for both samples. In producing the sample analyzed in FIG. 7a, $SiH_4$ gas at a flow rate of 45 sccm was introduced into the reactor; the sample of FIG. 7b was produced with $SiH_4$ gas at a flow rate of 25 sccm. No argon was introduced into the reactor for either sample.

The FTIR peaks corresponding to Si—H and N—H bonds, at wavenumbers of ~2100 $cm^{-1}$ and ~3200 $cm^{-1}$, respectively, are shown in both FIGS. 7a and 7b. As known in the art, the concentration of a constituent in the analyzed film is generally proportional to the area underlying the peak at the wavelength corresponding to that constituent. For both samples, as shown in the results of FIGS. 7a and 7b, the much larger peaks for N—H bonds as compared to the peaks for Si—H bonds indicates that such hydrogen as remains within the deposited nitride film is predominately bonded as N—H. A "figure of merit" has been derived as a ratio of the number of Si—H bonds to N—H bonds measured by FTIR in the analyzed film, after applying the appropriate scaling to account for any difference in FTIR absorbancy between the two types of hydrogen bonds. The analyses of FIGS. 7a and 7b each exhibit a figure of merit value of substantially less than 1.0, for example on the order of at most 0.05. Indeed, given that essentially no peak for the Si—H bonds is present, essentially no hydrogen in the form of Si—H bonds is present in either sample of the film (i.e, the figure of merit values are approaching zero). As such, it is believed that silicon nitride layer 46 deposited by way of PECVD deposition process 60 as described above provides good passivation for ferroelectric material 42 in capacitor 35, while itself causing little or no hydrogen contamination.

In the context of FeRAM cells, measurements have shown that the performance of memory cells including silicon nitride layer 46 deposited according to embodiments of this invention is equivalent to cells having HDP silicon nitride passivation, from the standpoint of read/write margin. However, the deposition of silicon nitride layer 46 using a parallel plate PECVD reactor, according to embodiments of this invention, attains this same passivation performance in combination with several important benefits over the HDP deposition of silicon nitride. Silicon nitride layer 46 has been observed to have dramatically better step coverage and a lower particulate contamination level than conventional HDP silicon nitride, and can be achieved at a cost/wafer, for this process, that is ⅓ to ⅕ that of the HDP deposition process. The management of the manufacturing process for depositing silicon nitride layer 46 is also greatly facilitated, according to embodiments of this invention, as the same parallel-plate PECVD reactor can be used for nitride deposition process 60 as those processes immediately ahead of and after this process.

Referring back to FIGS. 4 and 5d, optional PECVD nitride deposition process 61 may then be performed to deposit second silicon nitride layer 48 to overlie silicon nitride 46, if desired. This silicon nitride layer 48 may be deposited by way of PECVD according to conventional (i.e., $NH_3$) chemistries, for example as "UV nitride", to a thickness on the order of first silicon nitride layer 46 (e.g., 50 nm). A potential benefit of second silicon nitride layer 48, particularly if deposited by conventional PECVD processes, is improved conformity and step coverage, thus resulting in an easier topography for subsequent processes. In addition, it is contemplated that optional PEVCD nitride deposition process 61 may be performed in the same parallel-plate reactor 70 as used in nitride deposition process 60, and perhaps also as used in aluminum oxide deposition process 58. This in situ deposition of all three films, made possible by embodiments of this invention in which non-contaminating silicon nitride layer 46 is deposited in parallel-plate reactor 70, further facilitates the overall manufacturing process, reducing cost, and reducing the opportunity for contamination and processing bottlenecks. The necessity to use an HDP reactor for deposition of the first silicon nitride layer, according to conventional process flows, prevents this efficiency, while adding significant cost as mentioned above.

Following nitride deposition processes 60 (and 61, if performed), a second interlevel dielectric layer is then deposited overall, in process 62. This second interlevel dielectric may be a silicon dioxide layer (deposited by CVD), a "high-k" dielectric of either inorganic or "spin-on" organic material, as now common in the art. Typically this second interlevel dielectric is planarized, for example by way of chemical-mechanical polishing (CMP) to establish a topographically flat surface suitable for a next level of metal conductors, as known in the art. The manufacture of the integrated circuit is then completed, in process 65, by conventional processes for forming the various levels of conductors and the like.

According to embodiments of this invention, ferroelectric capacitors having good performance and stability can be fabricated and passivated, using processes suitable for and compatible with generally available process equipment, namely parallel plate PECVD plasma reactors. The resulting silicon nitride passivation films provide good step coverage, while maintaining any residual hydrogen in more tightly-bound form (N—H bonds) than conventional films, thus reducing hydrogen contamination of sensitive ferroelectric materials such as PZT. It is therefore contemplated that embodiments of this invention can provide high reliability ferroelectric memory cells, at reduced manufacturing cost.

While this invention has been described according to its embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of fabricating an integrated circuit including a ferroelectric capacitor, comprising the steps of:
    forming a capacitor structure comprised of a ferroelectric material disposed between two conductive plates, near a semiconducting surface of a body;
    placing the body into a chamber of a PECVD plasma reactor;
    operating the PECVD plasma reactor to deposit a first silicon nitride film over the capacitor structure, comprising:
        heating the chamber to a temperature of at least 350° C.;
        flowing a combination of gases comprising a silicon-bearing gas, and nitrogen gas as the sole nitrogen-bearing gas into the chamber; and
        applying radio frequency energy to electrodes in the PECVD plasma reactor to generate a plasma; and
    removing the body from the chamber.

2. The method of claim 1, wherein the combination of gases further comprises argon gas.

3. The method of claim 1, wherein the step of applying radio frequency energy comprises:
applying low frequency energy at a support electrode of the plasma reactor at which the body is placed, and high frequency energy at another electrode of the plasma reactor;
wherein the ratio of high frequency energy to low frequency energy is not greater than about 2.0.

4. The method of claim 3, wherein the ratio of high frequency energy to low frequency energy is zero.

5. The method of claim 1, further comprising:
after the operating step, flowing a second combination of gases comprising a silicon-bearing gas and ammonia gas into the chamber of the PECVD plasma reactor in which the body has been placed, while applying radio frequency energy to the electrodes in the plasma reactor to generate a second plasma, to deposit a second silicon nitride film over the first silicon nitride film.

6. The method of claim 5, further comprising:
prior to the step of operating the PECVD plasma reactor to deposit the first silicon nitride film, forming a film comprising aluminum oxide over the capacitor structure.

7. The method of claim 1, further comprising:
prior to the step of operating the PECVD plasma reactor to deposit the first silicon nitride film, forming a film comprising aluminum oxide over the capacitor structure.

8. The method of claim 1, wherein the first silicon nitride film has a ratio of Si—H bonds to N—H bonds substantially less than 1.0.

9. The method of claim 1, wherein the ferroelectric material comprises lead zirconium titanate.

* * * * *